(12) United States Patent
Wang

(10) Patent No.: US 10,269,281 B2
(45) Date of Patent: Apr. 23, 2019

(54) VOLTAGE CONTROL CIRCUIT AND METHOD, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Junwei Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 142 days.

(21) Appl. No.: 15/526,123

(22) PCT Filed: Oct. 21, 2016

(86) PCT No.: PCT/CN2016/102861
§ 371 (c)(1),
(2) Date: May 11, 2017

(87) PCT Pub. No.: WO2017/118156
PCT Pub. Date: Jul. 13, 2017

(65) Prior Publication Data
US 2018/0082629 A1    Mar. 22, 2018

(30) Foreign Application Priority Data
Jan. 6, 2016    (CN) .......................... 2016 1 0007120

(51) Int. Cl.
*G09G 3/36*    (2006.01)
*G11C 19/28*    (2006.01)
(Continued)

(52) U.S. Cl.
CPC ............. *G09G 3/20* (2013.01); *G09G 3/3266* (2013.01); *G09G 3/3677* (2013.01);
(Continued)

(58) Field of Classification Search
CPC ...... G09G 3/20; G09G 3/3266; G09G 3/3674; G09G 3/3677; G09G 2310/0267; G09G 2310/0286; G09G 2310/08; G11C 19/28
See application file for complete search history.

(56) References Cited

U.S. PATENT DOCUMENTS 10,019,959 B2 *   7/2018   Wang ..................... G11C 19/28
2006/0145999 A1    7/2006   Cho et al.
(Continued)

FOREIGN PATENT DOCUMENTS

| CN | 102651186 A | 8/2012 |
|---|---|---|
| CN | 103258495 A | 8/2013 |
| CN | 103578446 A | 2/2014 |
| CN | 105427793 A | 3/2016 |
| KR | 10-1451090 B1 | 10/2014 |
| TW | I398845 B | 6/2013 |

OTHER PUBLICATIONS

ISR & WO dated Jan. 24, 2017; PCT/CN2016/102861.
The First Chinese Office Action dated Aug. 23, 2017; Appln. 201610007120.3.

*Primary Examiner* — Patrick O Neill
(74) *Attorney, Agent, or Firm* — Ladas & Parry LLP

(57) ABSTRACT

A voltage control circuit and method, a gate driving circuit and a display device are provided. The voltage control circuit includes a gate-source voltage control unit (21), which is connected to the gate electrode of an output transistor (MO) and a pull-up node (PU) and configured to control the gate-source voltage of the output transistor (MO) to be less than a predetermined gate-source voltage by controlling the potential at the gate electrode of the output transistor (MO) when the potential at the pull-up node (PU) is at a low level in the output-off holding period of every display cycle. The predetermined gate-source voltage is less
(Continued)

than or equal to 0. All the transistors included by the gate-source voltage control unit (21) are N-type transistors. In every display cycle, the output-off holding period is set to follow an output period. The voltage control circuit can solve the problem of abnormal display at high temperatures caused by a relatively higher reverse turning-off gate-source voltage and at the same time improves the process compatibility.

20 Claims, 6 Drawing Sheets

(51) Int. Cl.
*G09G 3/20* (2006.01)
*G09G 3/3266* (2016.01)

(52) U.S. Cl.
CPC .............. *G09G 2310/0267* (2013.01); *G09G 2310/0286* (2013.01); *G09G 2310/08* (2013.01); *G11C 19/28* (2013.01)

(56) References Cited

U.S. PATENT DOCUMENTS

| | | |
|---|---|---|
| 2012/0256817 A1 | 10/2012 | Chen et al. |
| 2014/0043373 A1 | 2/2014 | Kim |
| 2015/0228353 A1 | 8/2015 | Qing et al. |
| 2017/0193887 A1* | 7/2017 | Wang .................... G09G 3/2092 |
| 2018/0233208 A1* | 8/2018 | Feng ........................ G09G 3/20 |

* cited by examiner

VOLTAGE CONTROL CIRCUIT AND METHOD, GATE DRIVING CIRCUIT AND DISPLAY DEVICE

TECHNICAL FIELD

Embodiments of the present disclosure relate to a voltage control circuit and a voltage control method, a gate driving circuit, and a display device.

BACKGROUND

In traditional GOA (Gate On Array) circuit designs, during the output turning-off holding phase (i.e., the phase after outputting a gate driving signal at a high level), the gate electrode of the output transistor is at a potential of −8V, while the output terminal for the gate driving signal is also at a potential of −8V, so that the gate-source voltage of the output transistor is 0V during the output turning-off holding phase, which may lead to abnormal display due to the relatively higher leakage current in a high-temperature environment. As illustrated in FIG. 1, a voltage control circuit uses an NAND gate 10 to control the gate-source voltage of the output transistor MO to be less than 0V during the output turning-off holding phase, i.e., to control the reverse control voltage Vgl2 to be input into the gate electrode of the transistor MO when the potential of the pull-up node PU is controlled to be at a low level. However, because the NAND gate 10 includes a P-type transistor as the first control transistor MC1, the voltage control circuit has poor process compatibility. The circuit as illustrated in FIG. 1 further includes a storage capacitor Cs, a second control transistor MC2 included by the NAND gate 10, an output terminal for gate driving signal OUTPUT, and a first clock signal CLK.

SUMMARY

Embodiments of the present disclosure provide a voltage control circuit and method, a gate driving circuit and a display device, which may solve the problem of abnormal display at high-temperatures caused by too high a reverse turning-off gate-source voltage and at the same time solve the problem of poor process compatibility.

An embodiment of the present disclosure provides a voltage control circuit configured to control a gate-source voltage of an output transistor, comprising: a gate-source voltage control unit connected with a gate electrode of the output transistor and a pull-up node and configured to control the gate-source voltage of the output transistor to be less than a predetermined gate-source voltage by controlling a potential at the gate electrode of the output transistor when a potential at the pull-up node is at a low level in an output-off holding period of every display cycle, wherein the predetermined gate-source voltage is equal to or less than 0, all transistors included by the gate-source voltage control unit are N-type transistors, and in every display cycle the output-off holding period is set to follow an output period.

In an example of the voltage control circuit, the voltage control circuit of the embodiment of the present disclosure further comprises a turning-on control unit connected with the pull-up node and the gate electrode of the output transistor respectively and configured to control the output transistor to turn on by controlling the potential at the gate electrode of the output transistor MO to be at a high level when a potential of the pull-up node is at a high level in the output period of every display cycle, wherein all transistors included by the turning-on control unit are all N-type transistors.

In an example of the voltage control circuit, the gate-source voltage control unit comprises: a potential control module connected respectively to the pull-up node and a control terminal and configured to control a potential at the control terminal to be a low level when the potential at the pull-up node is at a high level and to control the potential at the control terminal to be a high level when the potential at the pull-up node is at a low level; and a reverse turning-off control module connected respectively to the control terminal and the gate electrode of the output transistor and configured to control a reverse control voltage to be connected to the gate electrode of the output transistor when the control terminal is at the high level so as to control the gate-source voltage of the output transistor to be less than the predetermined gate-source voltage.

In an example of the voltage control circuit, the reverse turning-off control module comprises: a reverse turning-off control transistor having a gate electrode connected to the control terminal, a source electrode connected to the gate electrode of the output transistor, and a drain electrode connected to the reverse control voltage.

In an example of the voltage control circuit, the turning-on control unit comprises: a turning-on control transistor having a gate electrode and a drain electrode which are both connected to the pull-up node and a source electrode connected to the gate electrode of the output transistor, wherein a source electrode of the output transistor is connected to an output terminal of the gate driving circuit in a shift register cell and a drain electrode of the output transistor is connected to a first clock signal, and a storage capacitor is disposed between the pull-up node and the output terminal of the gate driving circuit.

In an example of the voltage control circuit, the potential control module comprises: a first control transistor having a gate electrode connected to the pull-up node, a source electrode connected to a low supply voltage and a drain electrode connected to the control terminal, wherein the control terminal is connected to a first control capacitor.

In an example of the voltage control circuit, the potential control module further comprises a first control capacitor and a second control transistor, wherein a drain electrode of the first control transistor is connected to the control terminal via the first control capacitor and the control terminal is connected to the high supply voltage via the second control transistor; a first end of the first control capacitor is connected to the drain electrode of the first control transistor; and the second control transistor has a gate electrode connected to the pull-up node, a source electrode connected to the second end of the first control capacitor and a drain electrode connected to the high supply voltage.

In an example of the voltage control circuit, a width-length ratio of the reverse turning-off control transistor is larger than that of the second control transistor, or a threshold voltage of the reverse turning-off control transistor is lower than that of the second control transistor.

In an example of the voltage control circuit, the potential control module is connected to a second clock signal and a third clock signal; the potential control module comprises: a first control transistor having a gate electrode connected to the pull-up node, a source electrode connected to a low supply voltage and a drain electrode connected to a control node; a first control capacitor having a first end connected to the control node; a second control transistor having a gate electrode and a drain electrode which are both connected to the third clock signal and a source electrode connected to the second end of the first control capacitor; a second control capacitor having a first end connected to the control node; a third control transistor having a gate electrode connected to the source electrode of the second control transistor, a source electrode connected to the second clock signal and a drain electrode connected to a second end of the second control capacitor; and a fourth control transistor having a gate electrode connected to the control node, a source electrode connected to the control terminal and a drain electrode connected to the source electrode of the second control transistor; wherein the first clock signal and the second clock signal are opposite in phase, and the third clock signal and the second clock signal are opposite in phase.

In an example of the voltage control circuit, a capacitance value of the first control capacitor is equal to that of the second control capacitor.

In an example of the voltage control circuit, the potential control module further comprises: a fifth control transistor having a gate electrode and a source electrode which are both connected to the first end of the first control capacitor and a drain electrode connected to the control node; and a sixth control transistor having a gate electrode and a drain electrode which are both connected to the control node and a source electrode connected to the drain electrode of the first control transistor.

Another embodiment of the present disclosure further provides a voltage control method adopting any of the above-mentioned voltage control circuits, the voltage control method comprising: in the output period of every display cycle, the first clock signal and the third clock signal being at high levels, the second clock signal being at a low level, the second control transistor and the third control transistor being turned on, the first control capacitor and the second control capacitor being charged by the first clock signal, the potential of the pull-up node being at a high level, and the turning-on control unit controlling connection between the pull-up node and the gate electrode of the output transistor to be turned on, such that the output transistor is turned on to output a gate driving signal while the first control transistor is turned-on to make a potential of the control node to be pulled down to the low supply voltage, turning off the fourth control transistor; in the output period of every display cycle, the potential at the pull-up node being at a low level, the turning-on control unit controlling the connection between the pull-up node and the gate electrode of the output transistor to be turned off, the first control transistor being turned off, the first control capacitor and the second control capacitor being charged by the third clock signal at an interval to make the potential at the control node maintain at a high level and thus to turn on the fourth control transistor, such that the gate-source voltage of the output transistor is controlled to be less than a predetermined gate-source voltage by the reverse turning-off control module controlling the reverse control voltage to be connected to the gate electrode of the output transistor, the predetermined gate-source voltage being less than or equal to 0.

Still another embodiment of the present disclosure provides a gate driving circuit comprising plural stages of shift register cells, the shift register cells comprise an output transistor and any of the above voltage control circuits, and the voltage control circuit is configured to control the gate-source voltage of the output transistor.

Further still another embodiment of the present disclosure provides a display device, comprising the above gate driving circuit.

BRIEF DESCRIPTION OF DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
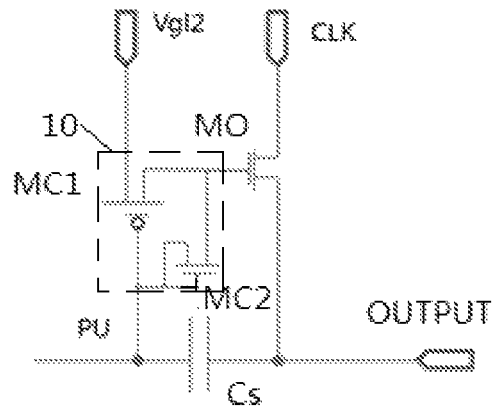
FIG. 1 is a circuit diagram of a voltage control circuit.
Figure 2:
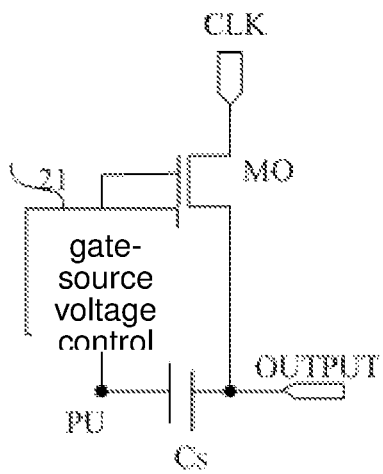
FIG. 2 is a structure diagram of a voltage control circuit in accordance with an embodiment of the present disclosure.

As illustrated in FIG. 2, a voltage control circuit in accordance with an embodiment of the present disclosure is configured to control the gate-source voltage of an output transistor MO; a gate-source voltage control unit 21 is connected with the gate electrode of the output transistor MO and a pull-up node PU respectively and configured to control the gate-source voltage of the output transistor MO to be less than a predetermined voltage, by controlling the potential of the gate electrode of the output transistor MO, when the potential of the pull-up node is at a low level during the output-off holding period in every display cycle, the predetermined gate-source voltage being equal to or less than 0. All the transistors included by the gate-source voltage control unit 21 are n-type transistors. In every display cycle, the output-off holding period is set to follow an output period.

In the voltage control circuit in the embodiment as illustrated in FIG. 2, the output transistor MO is also an N-type transistor.

All the transistors included by the gate-source voltage control unit in the voltage control circuit in accordance with the embodiment of the present disclosure are N-type transistors, so that the process compatibility can be improved while the problem of abnormal display at a high temperature due to a too high reverse turning-off gate-source voltage is resolved.

In the voltage control circuit in the embodiment as illustrated in FIG. 2, the source electrode of the output transistor MO is connected to the output terminal for gate driving signal OUTPUT, a storage capacitor Cs is connected between the pull-up node PU and the source electrode of the output transistor MO, and a first clock signal CLK is connected to the drain electrode of the output transistor MO.

For example, other signal may be input to the drain electrode of the output transistor MO, as long as it is ensured that proper gate driving signals are output from the output terminal for gate driving signal.

Figure 3:
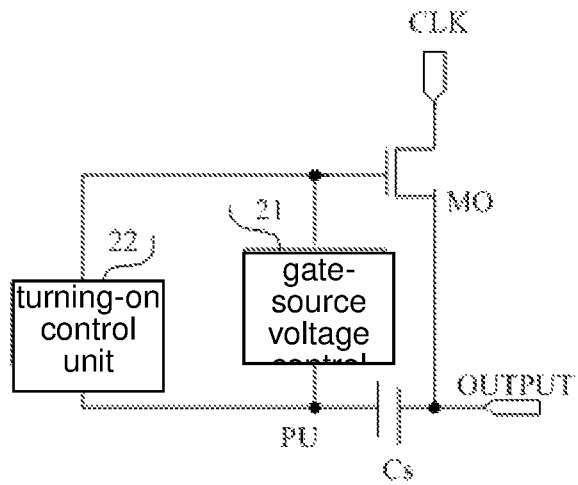
FIG. 3 is a structure diagram of a voltage control circuit in accordance with another embodiment of the present disclosure.

As illustrated in FIG. 3, the voltage control circuit in an embodiment of the present disclosure may further include a turning-on control unit 22, which is connected with the pull-up node PU and the gate electrode of the output transistor MO respectively and configured to control the output transistor to turn on, by controlling the potential of the gate electrode of the output transistor MO to be at a high level, when the potential of the pull-up node is at a high level during the output period in every display cycle.

For example, the transistors included by the turning-on control unit 22 are all N-type transistors to improve the process compatibility of the voltage control circuit.

Figure 4:
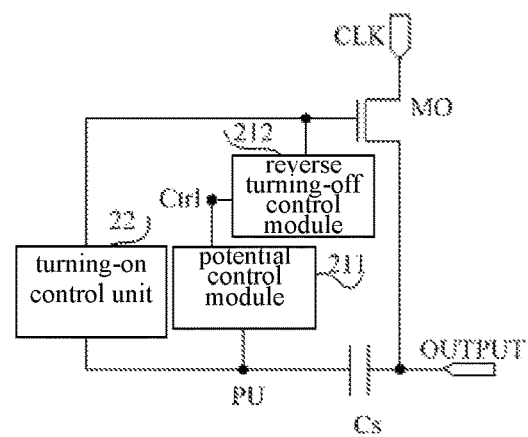
FIG. 4 is a structure diagram of a voltage-control circuit in accordance with yet another embodiment of the present disclosure.

As illustrated in FIG. 4, in the voltage control circuit in an embodiment of the present disclosure, the gate-source voltage control unit includes a potential control module 211 and a reverse turning-off control module 212. The potential control module 211 is connected with the pull-up node PU and a control terminal Ctrl and configured to control the potential of the control terminal Ctrl to be at a low level when the potential of the pull-up node PU is at a high level and to control the potential of the control terminal Ctrl to be at a high level when the potential of the pull-up node PU is at a low level.

The reverse turning-off control module 212 is connected with the control terminal Ctrl and the gate electrode of the output transistor MO and configured to control the reverse control voltage Vgl2 to be input to the gate electrode of the output transistor MO when the control terminal Ctrl is at a high level, so that the gate-source voltage of the output transistor MO is controlled to be less than the predetermined gate-source voltage and therefore the output transistor MO is controlled to be reversely turned off. At this point, the gate-source voltage of the output transistor MO is less than the predetermined gate-source voltage and thus provides a low gate-source voltage for reverse turning-off, so that the problem of abnormal display in a high-temperature environment due to a relatively larger leakage current resulted from the gate-source voltage of the output transistor being 0 can be avoided.

Figure 5:
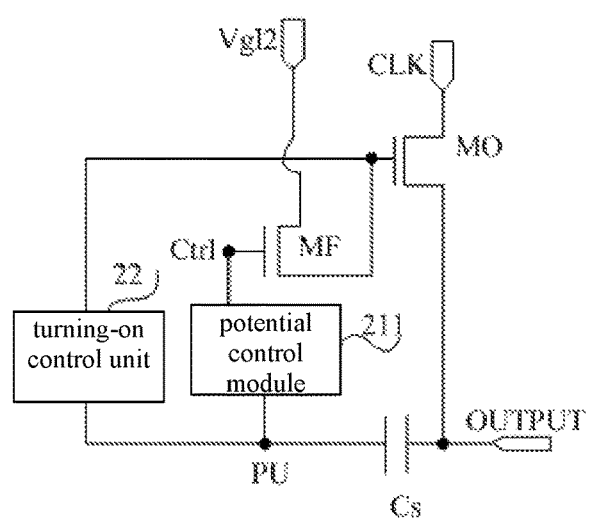
FIG. 5 is a structure diagram of a voltage-control circuit in accordance with yet another embodiment of the present disclosure.

As illustrated in FIG. 5, in a specific example, the reverse turning-off control module 212 may include a reverse turning-off control transistor MF, of which the gate electrode, the source electrode and the drain electrode are connected to the control terminal Ctrl, the gate electrode of the output transistor MO and the reverse control voltage Vgl2 respectively. For example, the reverse turning-off control transistor MF is an N-type transistor.

Figure 6:
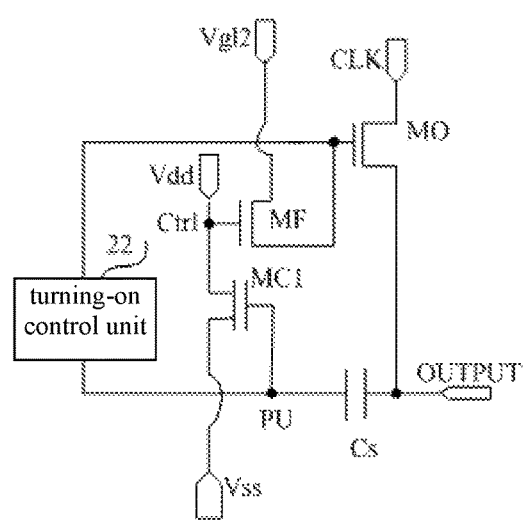
FIG. 6 is a circuit diagram of a voltage control circuit in accordance with yet another embodiment of the present disclosure.

In accordance with a specific implementation, as illustrated in FIG. 6, the potential control module includes a first control transistor MC1, of which the gate electrode, the source electrode and the drain electrode are connected to the pull-up node PU, a low supply voltage Vss, and the control terminal Ctrl respectively; the control terminal Ctrl is connected to a high supply voltage Vdd, and the first control transistor MC1 is an N-type transistor.

When the potential of the pull-up node PU is at a high level, the first control transistor MC1 is turned on and thus the control terminal Ctrl is connected to the low supply voltage Vss; when the potential of the pull-up node PU is at a low level, the first control transistor MC1 is turned off and thus the control terminal Ctrl is connected to the high supply voltage Vdd and at this point the reverse turning-off control transistor MF, the gate electrode of which is connected to the control terminal Ctrl is turned on to make the reverse control voltage Vgl2 connected to the gate electrode of the output transistor MO.

Figure 7:
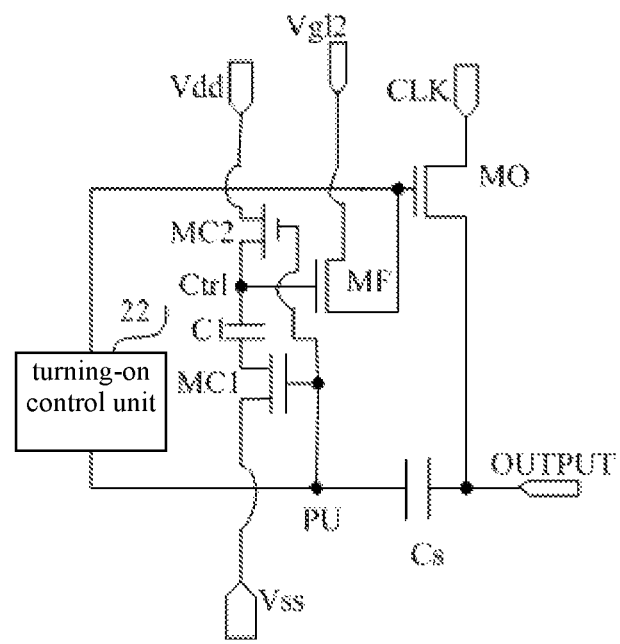
FIG. 7 is a structure diagram of a voltage control circuit in accordance with yet another embodiment of the present disclosure.

In accordance with another specific implementation, as illustrated in FIG. 7, the potential control module includes the first control transistor MC1, a first control capacitor C1 and a second control transistor MC2. The first control transistor MC1 has a gate electrode connected to the pull-up node PU, a source electrode connected to the low supply voltage Vss, and a drain electrode connected to the control terminal Ctrl. The drain electrode of the first control transistor MC1 is connected to the control terminal Ctrl via the first control capacitor C1 and the control terminal Ctrl is connected to the high supply voltage Vdd via the second control transistor MC2. The first end of the first control capacitor C1 is connected to the drain electrode of the first control transistor MC1. The second control transistor MC2 has a gate electrode connected to the pull-up node PU, a source electrode connected to the second end of the first control capacitor C1, and a drain electrode connected to the high supply voltage Vdd. Both the first control transistor MC1 and the second control transistor MC2 are N-type transistors.

The first control capacitor C1 is added to the potential control module included by the voltage control circuit in the embodiment of the present disclosure as illustrated in FIG. 7 to maintain the potential of the control terminal Ctrl, so that the reliability is improved and the problem that it is possible for the reverse control voltage Vgl2 to be not allowed to be connected to the potential of the reverse turning-off control transistor MF in the embodiment in FIG. 6 can be avoided.

Preferably, in the embodiment as illustrated in FIG. 7, the width-length (W/L) ratio of the reverse turning-off control transistor is larger than that of the second control transistor MC2, or the threshold voltage of the reverse turning-off control transistor is less than that of the second control transistor MC2, so that the influence of the voltage at the second end of the first control capacitor C1 on the gate electrode of the transistor MF is reduced when the potential of the pull-up node PU is at a high level.

Figure 8:
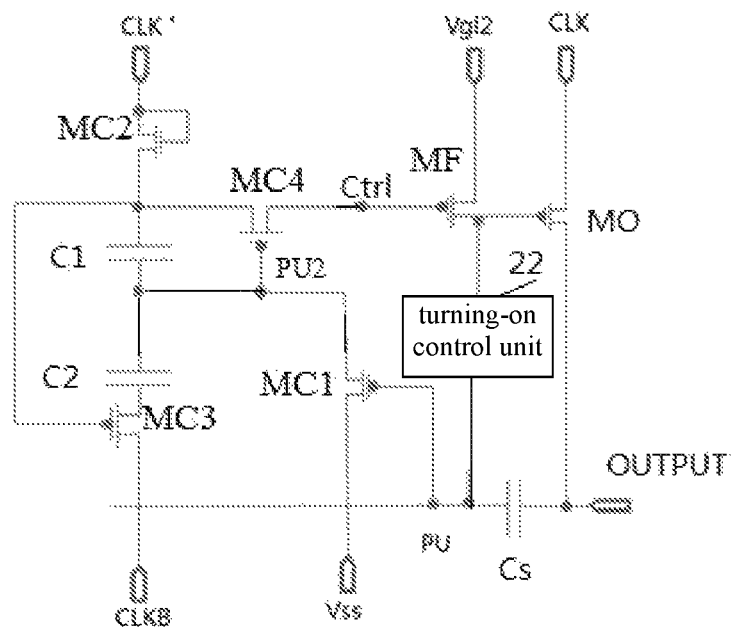
FIG. 8 is a structure diagram of a voltage control circuit in accordance with yet another embodiment of the present disclosure.

In accordance with yet another specific implementation, as illustrated in FIG. 8, the potential control module includes the first control transistor MC1, the first control capacitor C1, the second control transistor MC2, the second control capacitor C2, a third control transistor MC3 and a fourth control transistor MC4.

The first control transistor MC1 has a gate electrode connected to the pull-up node PU, a source electrode connected to the low supply voltage Vdd, and a drain electrode connected to a control node PU2. The first end of the first control capacitor C1 is connected to the control node PU2. The second control transistor MC2 has both a gate electrode and a drain electrode that are connected to a third clock signal CLK' and a source electrode connected to the second end of the first control capacitor C1. The first end of the second control capacitor C2 is connected to the control node PU2. The third control transistor MC3 has a gate electrode connected to the source electrode of the second control transistor MC2, a source electrode connected to a second clock signal CLKB, and a drain electrode connected to the second end of the second control capacitor C2. The fourth control transistor MC4 has a gate electrode connected to the control node PU2, a source electrode connected to the control terminal Ctrl, and a drain electrode connected to the source electrode of the second control capacitor C2. The third clock signal CLK' is opposite to the second clock signal CLKB in phase and has the same waveform as the first clock signal CLK.

In FIG. 8, although the third clock signal CLK' has the same waveform as the first clock signal CLK, the two signals are not input through the same one line, so that the output stability will not be affected during potential switching in a GOA circuit and signal interference will be reduced.

In the embodiment as illustrated in FIG. 8, the first control transistor MC1, the second control transistor MC2, the third control transistor MC3 and the fourth control transistor MC4 are all N-type transistors.

During operation of the voltage control circuit in an embodiment of the present disclosure as illustrated in FIG. 8, a loop is repeatedly formed through the third clock signal CLK' and the second clock signal CLKB at an interval to charge the first control capacitor C1 and the second control capacitor C2 so that the voltage provided by the gate electrode of the reverse turning-off control transistor MF become more stable. In the embodiment as illustrated in FIG. 7, the potential at the control terminal Ctrl (i.e., the gate electrode of the reverse turning-off control transistor MF) is only controlled by the first control capacitor C1, and the capacitance value of the first control capacitor C1 needs to be increased in order to achieve the same stability as in the embodiment as illustrated in FIG. 8, however this modification will increase both the size and the cost of the circuit of a shift register cell.

Preferably, in an embodiment as illustrated in FIG. 8, the capacitance value of the first control capacitor C1 is equal to that of the second control capacitor C2 to ensure that the potential between the first control capacitor C1 and the second control capacitor C2 will not drift when polarity reversal occurs in the third clock signal CLK' and the second clock signal CLKB.

Figure 9:
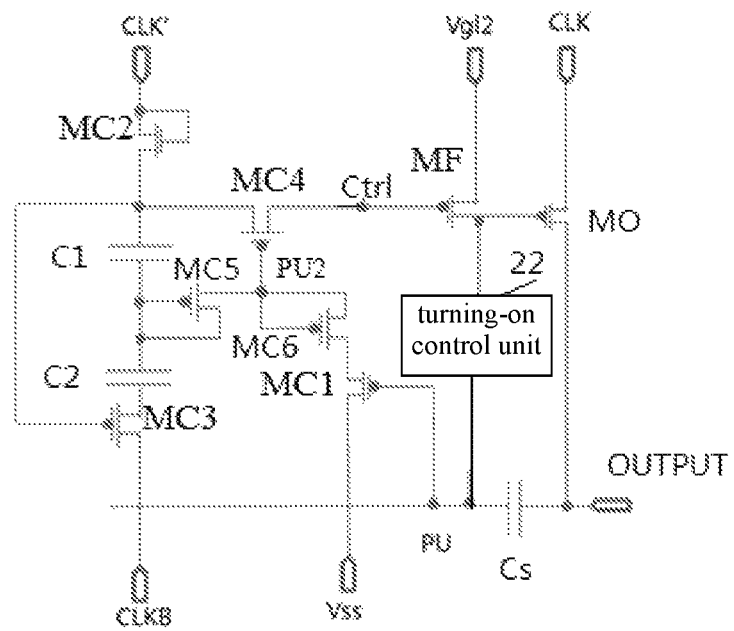
FIG. 9 is a structure diagram of a voltage control circuit in accordance with yet another embodiment of the present disclosure.

As illustrated in FIG. 9, based on the embodiment as illustrated in FIG. 8, the potential control module may further include a fifth control transistor MC5 and a sixth control transistor MC6.

The fifth control transistor MC5 has both a gate electrode and a source electrode which are connected to the first end of the first control capacitor C1 and a drain electrode connected to the control node PU2, and the sixth control transistor MC6 has both a gate electrode and a drain electrode that are connected to the control node PU2 and a source electrode connected to the drain electrode of the first control transistor MC1.

In the embodiment as illustrated in FIG. 9, the first control transistor MC1, the second control transistor MC2, the third control transistor MC3, the fourth control transistor MC4, the fifth control transistor MC5 and the sixth control transistor MC6 are all N-type transistors.

In a specific implementation, the turning-on control unit may include a turning-on control transistor, of which a gate electrode and a drain electrode are both connected to the pull-up node and a source electrode connected to the gate electrode of the output transistor; a source electrode of the output transistor is connected to the output terminal of the gate driving circuit of a shift register cell and a drain electrode of the output transistor is connected to the first clock signal; a storage capacitor is disposed between the pull-up node and the output terminal of the gate driving circuit. The above-mentioned turning-on control transistor will be illustrated in the following three specific embodiments.

The voltage control circuit in accordance with the present disclosure will be illustrated in the following three specific embodiments.

Figure 10:
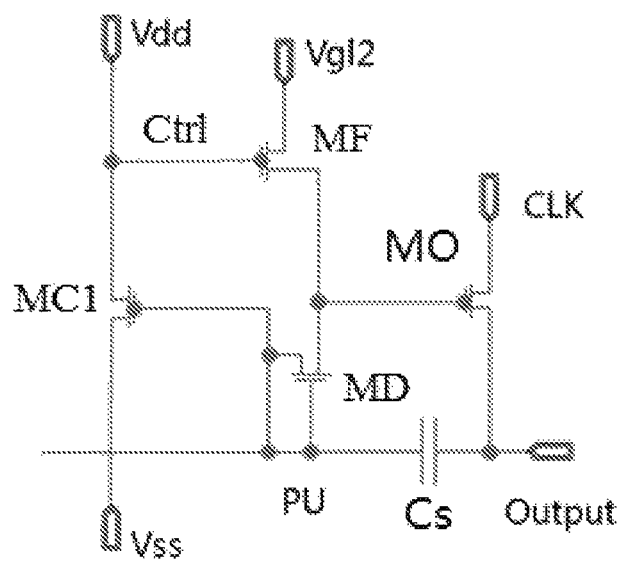
FIG. 10 is a circuit diagram of a first specific embodiment of the voltage control circuit in accordance with the present disclosure.

As illustrated in FIG. 10, the voltage control circuit in a first specific embodiment of the present disclosure includes a gate-source voltage control unit and a turning-on control unit; the gate-source voltage control unit includes a potential control module and a reverse turning-off control module; the turning-on control unit includes a turning-on control transistor having a gate electrode and a drain electrode which are both connected to a pull-up node PU and a source electrode connected to the gate electrode of an output transistor MO; the output transistor MO has a source electrode connected to the output terminal OUTPUT of the gate driving circuit in a shift register cell and a drain electrode connected to a first clock signal CLK; a storage capacitor Cs is disposed between the pull-up node PU and the output terminal OUTPUT of the gate driving circuit; the reverse turning-off control module includes a reverse turning-off control transistor MF, of which a gate electrode, a source electrode and a drain electrode are connected to a control terminal Ctrl, the gate electrode of the output transistor MO and a reverse control voltage Vgl2 respectively; the potential control module includes a first control transistor MC1, of which a gate electrode, a source electrode and a drain electrode are connected to the pull-up node PU, a low supply voltage Vss and the control terminal Ctrl respectively; the control terminal Ctrl is connected to a high supply voltage Vdd.

Here, the transistors MO, MF, MD and MC1 are all N-type transistors.

During operation of the voltage control circuit in the first specific embodiment of the present disclosure, when the potential at the pull-up node PU is at a high level, the first control transistor MC1 is turned on, the potential at the control terminal Ctrl is pulled down by the voltage Vss and then the output transistor MO is turned on to complete the charging of the storage capacitor Cs and output the first clock signal CLK to the output terminal OUTPUT; when the potential at the pull-up node PU is at a low level, the control terminal Ctrl is connected to the voltage Vdd, the output transistor MO is turned off and the reverse control voltage Vgl2 is applied to the gate electrode of the output transistor MO in order to realize the purpose of reducing the reverse turning-off gate-source voltage of the output transistor MO. Preferably, the first control transistor MC1 has a relatively higher width-length ratio to ensure that the potential at the control terminal Ctrl can be pulled down rapidly when the potential at the pull-up node is at a high level. The effect of the pulling down operation equals to connecting in series a resistor between with the output terminal for the high supply voltage and the output terminal for the low supply voltage.

Figure 11:
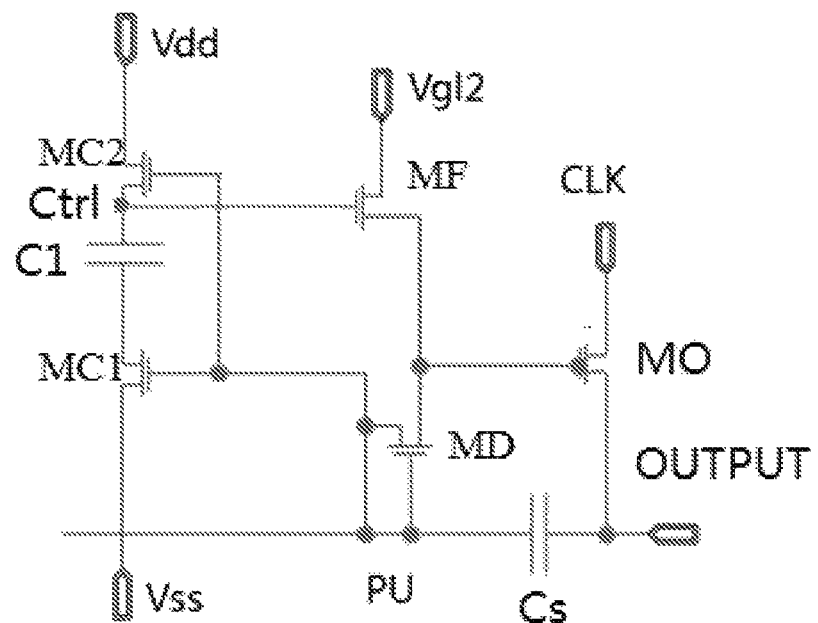
FIG. 11 is a circuit diagram of a second specific embodiment of the voltage control circuit in accordance with present disclosure.

As illustrated in FIG. 11, the voltage control circuit in the first specific embodiment of the present disclosure includes a gate-source voltage control unit and a turning-on control unit; the gate-source voltage control unit includes a potential control module and a reverse turning-off control module; the turning-on control unit includes a turning-on control transistor having a gate electrode and a drain electrode which are both connected to a pull-up node PU and a source electrode connected to the gate electrode of an output transistor MO; the output transistor MO has a source electrode connected to the output terminal OUTPUT of the gate driving circuit in a shift register cell and a drain electrode connected to a first clock signal CLK; a storage capacitor Cs is disposed between the pull-up node PU and the output terminal OUTPUT of the gate driving circuit; the reverse turning-off control module includes a reverse turning-off control transistor MF, of which a gate electrode, a source electrode and a drain electrode are connected to the control terminal Ctrl, the gate electrode of the output transistor MO and a reverse control voltage Vgl2 respectively; the potential control module includes a first control transistor MC1, a first control capacitor C1 and a second control transistor MC2.

The first control transistor MC1 has a gate electrode connected with the pull-up node PU, a source electrode connected to a low supply voltage Vss and a drain electrode connected to the control terminal Ctrl. The drain electrode of the first control transistor MC1 is connected to the control terminal Ctrl via the first control capacitor C1; the control terminal Ctrl is connected to a high supply voltage Vdd via the second control transistor MC2. The first end of the first control capacitor C1 is connected to the drain electrode of the first control transistor MC1. The second control transistor MC2 has a gate electrode connected to the pull-up node PU, a source electrode connected to the second terminal of the first control capacitor C1, and a drain electrode connected to the high supply voltage Vdd.

Here, the transistors MO, MF, MD, MC1, MC2 and MC3 are all N-type transistors.

Based on the first specific embodiment, the voltage control circuit in the second specific embodiment has the first control capacitor C1 and the second control transistor MC2 that are added.

During operation of the voltage control circuit in the second specific embodiment of the present disclosure, when the potential at the pull-up node PU is at a high level, the control terminal CLK controls the gate electrode normally to allow the output terminal OUTPUT to output while the first control capacitor C1 is charged; when the potential at the pull-up node PU is at a low level, the voltage across the first control capacitor C1 is applied to the gate electrode of the reverse turning-off control transistor MF, and the reverse control voltage Vgl2 that lasts for the time period of an image frame is connected to the gate electrode of the output transistor MO.

The first control capacitor C1 is added to the potential control module included by the voltage control circuit in the second specific embodiment of the present disclosure to maintain the potential at the control terminal Ctrl, improving the reliability and preventing the problem in the first specific embodiment that it is possible for the potential of the gate electrode of the reverse turning-off control transistor MF to be not allowed to be connected to the reverse control voltage Vgl2 due to the current leakage from the first control transistor MC1.

Preferably, in the voltage control circuit in the second specific embodiment of the present disclosure, the width-length ratio of the reverse turning-off control transistor MF is larger than that of the first control transistor MC1 or the reverse turning-off control transistor MF is configured to have a threshold different from that of the first control transistor MC1 to reduce the influence of the voltage across the storage capacitor C1 on the gate electrode of the reverse turning-off control transistor MF when the pull-up node turns on the output transistor MO.

Figure 12:
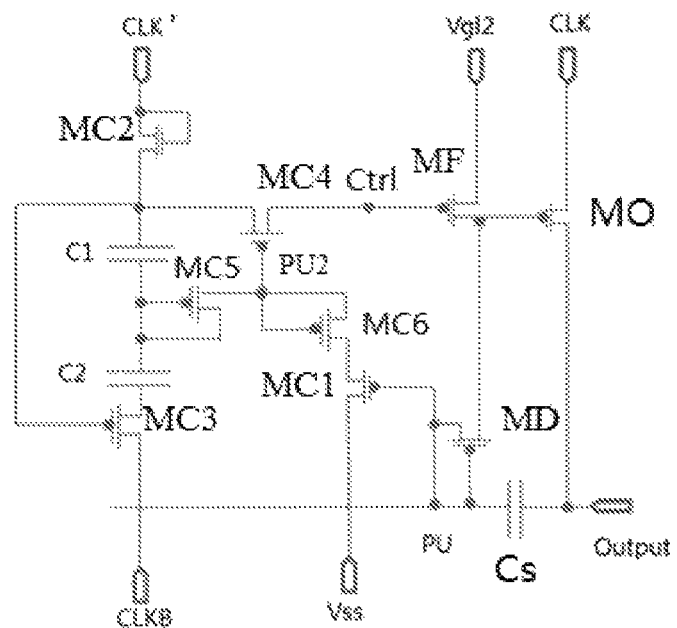
FIG. 12 is a circuit diagram of a third specific embodiment of the voltage control circuit in accordance with the present disclosure.

As illustrated in FIG. 12, The voltage control circuit in the third embodiment of the present disclosure includes a gate-source voltage control unit and a turning-on control unit. The gate-source voltage control unit includes a potential control module and a reverse turning-off control module. The turning-on control unit includes a turning-on control transistor having a gate electrode and a drain electrode which are both connected to a pull-up node PU and a source electrode connected to the gate electrode of an output transistor MO. The output transistor MO has a source electrode connected to the output terminal OUTPUT of the gate driving circuit in a shift register cell and a drain electrode connected to a first clock signal CLK. A storage capacitor Cs is disposed between the pull-up node PU and the output terminal OUTPUT of the gate driving circuit. The reverse turning-off control module includes a reverse turning-off control transistor MF, of which a gate electrode, a source electrode and a drain electrode are respectively connected to a control terminal Ctrl, the gate electrode of the output transistor MO and a reverse control voltage Vgl2. The potential control module is connected to a second clock signal CLKB and a third clock signal CLK'.

The potential control module includes: a first control transistor MC1, of which a gate electrode, a source electrode and a drain electrode are respectively connected to the pull-up node PU, a low supply voltage Vdd and a control node PU2; a first control capacitor C1, a first end of which is connected to the control node PU2; a second control transistor MC2 having a gate electrode and a drain electrode which are both connected to the third clock signal CLK' and a source electrode connected to the second end of the first control capacitor C1; a second control capacitor C2, a first end of which is connected to the control node PU2; a third control transistor MC3, of which a gate electrode, a source electrode and a drain electrode are respectively connected to the source electrode of the second control transistor MC2, the second clock signal CLKB and the second end of the second control capacitor C2; a fourth control transistor MC4, of which a gate electrode, a source electrode and a drain electrode are respectively connected to the control node PU2, the control terminal Ctrl and the source electrode of the second control transistor MC2; a fifth control transistor MC5 having a gate electrode and a source electrode that are both connected to the first end of the first control capacitor C1 and a drain electrode connected to the control node PU2; and a sixth control transistor MC6 having a gate electrode and a drain electrode that are both connected to the control node PU2 and a source electrode connected to the drain electrode of the first control transistor MC1.

The transistors MO, MF, MD, MC1, MC2, MC3, MC4, MC5 and MC6 are all N-type transistors.

The first clock signal CLK and the second clock signal CLKB are opposite in phase and the third clock signal CLK' has the same waveform as the first clock signal CLK.

With respect to the second specific embodiment, the voltage control circuit in the third specific embodiment of the present disclosure is further modified and characterized in that the first control capacitor C1 and the second control capacitor C2 of the same capacitance value are incorporated and the high supply voltage Vdd is replaced by the clock signals CLK and CLKB, eliminating the high supply voltage Vdd and achieving another way of implementation; the clock signal CLK is responsible for charging the first control capacitor C1 and the second control capacitor C2; the voltage of the gate electrode of the reverse turning-off control transistor MF is controlled by the second control capacitor C2.

Figure 13:
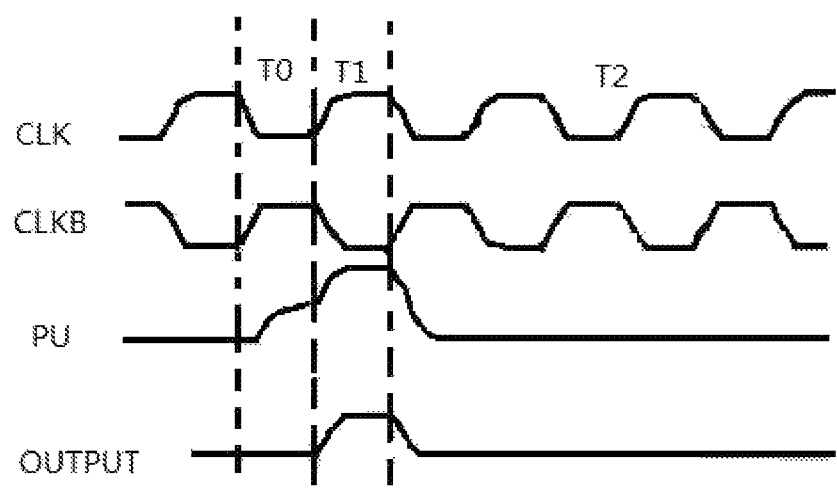
FIG. 13 is a timing diagram for operation of the third specific embodiment of the voltage control circuit in accordance with the present disclosure.

During operation of the voltage control circuit in the third specific embodiment of the present disclosure, as illustrated in FIG. 13, in the preparation period T0 of every display cycle, the second clock signal CLKB is at a high level, the clock signals CLK and CLK' are at low levels, both the transistors MC2 and MC3 are turned off, no loop is formed between the first control capacitor C1 and the second control capacitor C2 so that the first control capacitor C1 and the second control capacitor C2 are not charged, and the reverse turning-off control transistor MF is turned off;

in the output period T1 of every display cycle, the first clock signal CLK and the third clock signal CLK' are at high levels, the second clock signal CLKB is at a low level, both the transistors MC2 and MC3 are turned on, the first control capacitor C1 and the second control capacitor C2 are charged through the first clock signal CLK, the potential at the pull-up node is at a high level, the transistor MD is turned on, and as a result the pull-up node PU is connected with the gate electrode of the transistor MO, so that the transistor MO is turned on to control the first clock signal CLK to be output to the output terminal OUTPUT while the transistor MC1 is turned on to control the potential at the control node PU2 to be pulled down to the Vss, turning off the transistor MC4; and in the output-off holding period T2 of every display cycle, the potential at the pull-up node PU is at a low level, the transistor MD is turned off, the pull-up node PU is thus not connected with the gate electrode of the output transistor, the transistor MC1 is turned off, a loop is repeatedly formed through the third clock signal CLK' and the second clock signal CLKB at an interval to charge the first control capacitor C1 and the second control capacitor C2, so that the potential at the control node PU2 is no longer pulled down but varies along with the potential on the upper side of the second control capacitor C2 to ensure that the PU2 is in a stable on-state, i.e., the potential of the control node PU2 is maintained at a high level to turn on the fourth control transistor MC4, provide the gate electrode of the transistor MF with a more stable turning-on voltage and therefore control the reverse control voltage Vgl2 to be connected to the gate electrode of the transistor MO more stably.

Preferably, the reverse control voltage Vgl2 is a voltage lower than the common low-level Vgl to ensure that the output terminal OUTPUT of the gate driving circuit can maintain a relatively lower gate-source voltage in the output turning-off holding phase so as to alleviate the poor abnormal display caused by a relatively larger leakage current.

During practical operation, in the voltage control circuit in the embodiments illustrated in FIGS. 2-12, the pull-up node PU may be connected with the input terminal Input of a GOA (Gate On Array) unit (the input terminal Input and the GOA unit are not illustrated in FIGS. 2-11).

A voltage control method in an embodiment of the present disclosure uses the voltage control circuit described above, and the method includes the following operations.

In the output period of every display cycle, the first clock signal and the third clock signal are at high levels, the second clock signal is at a low level, the second control transistor and the third control transistor are turned on, the first control capacitor and the second control capacitor are charged by the first clock signal, the potential of the pull-up node is at a high level, and the turning-on control unit controls connection between the pull-up node and the gate electrode of the output transistor to be turned on, such that the output transistor is turned on to output a gate driving signal while the first control transistor is turned-on to make a potential of the control node to be pulled down to the low supply voltage, turning off the fourth control transistor.

In the output period of every display cycle, the potential at the pull-up node is at a low level, the turning-on control unit controls the connection between the pull-up node and the gate electrode of the output transistor to be turned off, the first control transistor is turned off, the first control capacitor and the second control capacitor are charged by the third clock signal at an interval to make the potential at the control node maintain at a high level and thus to turn on the fourth control transistor, such that the gate-source voltage of the output transistor is controlled to be less than a predetermined gate-source voltage by the reverse turning-off control module controlling the reverse control voltage to be connected to the gate electrode of the output transistor, the predetermined gate-source voltage being less than or equal to 0.

A shift register cell in an embodiment of the present disclosure includes an output transistor and further the voltage control circuit described above that is configured to control the gate-source voltage of the output transistor.

A gate driving circuit in an embodiment of the present disclosure includes multiple stages of shift register cells described above.

A display device in an embodiment of the present disclosure includes the above-mentioned gate driving circuit.

What are described above is related to the illustrative embodiments of the disclosure only and not limitative to the scope of the disclosure; the scopes of the disclosure are defined by the accompanying claims.

The application claims priority to the Chinese patent application No. 201610007120.3, filed Jan. 6, 2016, the entire disclosure of which is incorporated herein by reference as part of the present application.

What is claimed is:

1. A voltage control circuit configured to control a gate-source voltage of an output transistor, comprising:
a gate-source voltage control unit connected with a gate electrode of the output transistor and a pull-up node and configured to control the gate-source voltage of the output transistor to be less than a predetermined gate-source voltage by controlling a potential at the gate electrode of the output transistor when a potential at the pull-up node is at a low level in an output-off holding period of every display cycle,
wherein the predetermined gate-source voltage is equal to or less than 0, all transistors included by the gate-source voltage control unit are N-type transistors, and in every display cycle the output-off holding period is set to follow an output period.

2. The voltage control circuit of claim 1, further comprising:
a turning-on control unit connected with the pull-up node and the gate electrode of the output transistor respectively and configured to control the output transistor to turn on by controlling the potential at the gate electrode of the output transistor MO to be at a high level when a potential of the pull-up node is at a high level in the output period of every display cycle,
wherein all transistors included by the turning-on control unit are all N-type transistors.

3. The voltage control circuit of claim 2, wherein the gate-source voltage control unit comprises:
a potential control module connected respectively to the pull-up node and a control terminal and configured to control a potential at the control terminal to be a low level when the potential at the pull-up node is at a high level and to control the potential at the control terminal to be a high level when the potential at the pull-up node is at a low level; and
a reverse turning-off control module connected respectively to the control terminal and the gate electrode of the output transistor and configured to control a reverse control voltage to be connected to the gate electrode of the output transistor when the control terminal is at the high level so as to control the gate-source voltage of the output transistor to be less than the predetermined gate-source voltage.

4. The voltage control circuit of claim 3, wherein the reverse turning-off control module comprises:
a reverse turning-off control transistor having a gate electrode connected to the control terminal, a source electrode connected to the gate electrode of the output transistor, and a drain electrode connected to the reverse control voltage.

5. The voltage control circuit of claim 4, wherein the potential control module comprises:
a first control transistor having a gate electrode connected to the pull-up node, a source electrode connected to a low supply voltage and a drain electrode connected to the control terminal,
wherein the control terminal is connected to a first control capacitor.

6. The voltage control circuit of claim 4, wherein the potential control module is connected to a second clock signal and a third clock signal;
the potential control module comprises:
a first control transistor having a gate electrode connected to the pull-up node, a source electrode connected to a low supply voltage and a drain electrode connected to a control node;
a first control capacitor having a first end connected to the control node;
a second control transistor having a gate electrode and a drain electrode which are both connected to the third clock signal and a source electrode connected to the second end of the first control capacitor;
a second control capacitor having a first end connected to the control node;
a third control transistor having a gate electrode connected to the source electrode of the second control transistor, a source electrode connected to the second clock signal and a drain electrode connected to a second end of the second control capacitor; and
a fourth control transistor having a gate electrode connected to the control node, a source electrode connected to the control terminal and a drain electrode connected to the source electrode of the second control transistor;
wherein a first clock signal and the second clock signal are opposite in phase, and the third clock signal and the second clock signal are opposite in phase.

7. The voltage control circuit of claim 3, wherein the potential control module comprises:
a first control transistor having a gate electrode connected to the pull-up node, a source electrode connected to a low supply voltage and a drain electrode connected to the control terminal,
wherein the control terminal is connected to a first control capacitor.

8. The voltage control circuit of claim 7, wherein the potential control module further comprises the first control capacitor and a second control transistor,
wherein a drain electrode of the first control transistor is connected to the control terminal via the first control capacitor and the control terminal is connected to a high supply voltage via the second control transistor;
a first end of the first control capacitor is connected to the drain electrode of the first control transistor; and
the second control transistor has a gate electrode connected to the pull-up node, a source electrode connected to the second end of the first control capacitor and a drain electrode connected to the high supply voltage.

9. The voltage control circuit of claim 8, wherein a width-length ratio of a reverse turning-off control transistor is larger than that of the second control transistor, or
a threshold voltage of the reverse turning-off control transistor is lower than that of the second control transistor.

10. The voltage control circuit of claim 3, wherein the potential control module is connected to a second clock signal and a third clock signal;
the potential control module comprises:
a first control transistor having a gate electrode connected to the pull-up node, a source electrode connected to a low supply voltage and a drain electrode connected to a control node;
a first control capacitor having a first end connected to the control node;
a second control transistor having a gate electrode and a drain electrode which are both connected to the third clock signal and a source electrode connected to the second end of the first control capacitor;

a second control capacitor having a first end connected to the control node;

a third control transistor having a gate electrode connected to the source electrode of the second control transistor, a source electrode connected to the second clock signal and a drain electrode connected to a second end of the second control capacitor; and a fourth control transistor having a gate electrode connected to the control node, a source electrode connected to the control terminal and a drain electrode connected to the source electrode of the second control transistor;

wherein a first clock signal and the second clock signal are opposite in phase, and the third clock signal and the second clock signal are opposite in phase.

11. The voltage control circuit of claim 10, wherein a capacitance value of the first control capacitor is equal to that of the second control capacitor.

12. A voltage control method adopting the voltage control circuit of claim 11, the voltage control method comprising:

in the output period of every display cycle, the first clock signal and the third clock signal being at high levels, the second clock signal being at a low level, the second control transistor and the third control transistor being turned on, the first control capacitor and the second control capacitor being charged by the first clock signal, the potential of the pull-up node being at a high level, and the turning-on control unit controlling connection between the pull-up node and the gate electrode of the output transistor to be turned on, such that the output transistor is turned on to output a gate driving signal while the first control transistor is turned-on to make a potential of the control node to be pulled down to the low supply voltage, turning off the fourth control transistor;

in the output period of every display cycle, the potential at the pull-up node being at a low level, the turning-on control unit controlling the connection between the pull-up node and the gate electrode of the output transistor to be turned off, the first control transistor being turned off, the first control capacitor and the second control capacitor being charged by the third clock signal at an interval to make the potential at the control node maintain at a high level and thus to turn on the fourth control transistor, such that the gate-source voltage of the output transistor is controlled to be less than a predetermined gate-source voltage by the reverse turning-off control module controlling the reverse control voltage to be connected to the gate electrode of the output transistor, the predetermined gate-source voltage being less than or equal to 0.

13. The voltage control circuit of claim 10, wherein the potential control module further comprises:

a fifth control transistor having a gate electrode and a source electrode which are both connected to the first end of the first control capacitor and a drain electrode connected to the control node; and a sixth control transistor having a gate electrode and a drain electrode which are both connected to the control node and a source electrode connected to the drain electrode of the first control transistor.

14. A voltage control method adopting the voltage control circuit of claim 13, the voltage control method comprising:

in the output period of every display cycle, the first clock signal and the third clock signal being at high levels, the second clock signal being at a low level, the second control transistor and the third control transistor being turned on, the first control capacitor and the second control capacitor being charged by the first clock signal, the potential of the pull-up node being at a high level, and the turning-on control unit controlling connection between the pull-up node and the gate electrode of the output transistor to be turned on, such that the output transistor is turned on to output a gate driving signal while the first control transistor is turned-on to make a potential of the control node to be pulled down to the low supply voltage, turning off the fourth control transistor;

in the output period of every display cycle, the potential at the pull-up node being at a low level, the turning-on control unit controlling the connection between the pull-up node and the gate electrode of the output transistor to be turned off, the first control transistor being turned off, the first control capacitor and the second control capacitor being charged by the third clock signal at an interval to make the potential at the control node maintain at a high level and thus to turn on the fourth control transistor, such that the gate-source voltage of the output transistor is controlled to be less than a predetermined gate-source voltage by the reverse turning-off control module controlling the reverse control voltage to be connected to the gate electrode of the output transistor, the predetermined gate-source voltage being less than or equal to 0.

15. A voltage control method adopting the voltage control circuit of claim 10, the voltage control method comprising:

in the output period of every display cycle, the first clock signal and the third clock signal being at high levels, the second clock signal being at a low level, the second control transistor and the third control transistor being turned on, the first control capacitor and the second control capacitor being charged by the first clock signal, the potential of the pull-up node being at a high level, and the turning-on control unit controlling connection between the pull-up node and the gate electrode of the output transistor to be turned on, such that the output transistor is turned on to output a gate driving signal while the first control transistor is turned-on to make a potential of the control node to be pulled down to the low supply voltage, turning off the fourth control transistor;

in the output period of every display cycle, the potential at the pull-up node being at a low level, the turning-on control unit controlling the connection between the pull-up node and the gate electrode of the output transistor to be turned off, the first control transistor being turned off, the first control capacitor and the second control capacitor being charged by the third clock signal at an interval to make the potential at the control node maintain at a high level and thus to turn on the fourth control transistor, such that the gate-source voltage of the output transistor is controlled to be less than a predetermined gate-source voltage by the reverse turning-off control module controlling the reverse control voltage to be connected to the gate electrode of the output transistor, the predetermined gate-source voltage being less than or equal to 0.

16. The voltage control circuit of claim 2, wherein the turning-on control unit comprises:

a turning-on control transistor having a gate electrode and a drain electrode which are both connected to the pull-up node and a source electrode connected to the gate electrode of the output transistor, wherein a source electrode of the output transistor is connected to an output terminal of the gate driving circuit in a shift register cell and a drain electrode of the output transistor is connected to a first clock signal, and a storage capacitor is disposed between the pull-up node and the output terminal of the gate driving circuit.

17. The voltage control circuit of claim 16, wherein a potential control module comprises:
   a first control transistor having a gate electrode connected to the pull-up node, a source electrode connected to a low supply voltage and a drain electrode connected to a control terminal,
   wherein the control terminal is connected to a first control capacitor.

18. The voltage control circuit of claim 16, wherein a potential control module is connected to a second clock signal and a third clock signal;
   the potential control module comprises:
   a first control transistor having a gate electrode connected to the pull-up node, a source electrode connected to a low supply voltage and a drain electrode connected to a control node;
   a first control capacitor having a first end connected to the control node;
   a second control transistor having a gate electrode and a drain electrode which are both connected to the third clock signal and a source electrode connected to the second end of the first control capacitor;
   a second control capacitor having a first end connected to the control node;
   a third control transistor having a gate electrode connected to the source electrode of the second control transistor, a source electrode connected to the second clock signal and a drain electrode connected to a second end of the second control capacitor; and
   a fourth control transistor having a gate electrode connected to the control node, a source electrode connected to a control terminal and a drain electrode connected to the source electrode of the second control transistor;
   wherein the first clock signal and the second clock signal are opposite in phase, and the third clock signal and the second clock signal are opposite in phase.

19. A gate driving circuit comprising plural stages of shift register cells,
   wherein the shift register cells comprise an output transistor and the voltage control circuit of claim 1, and
   the voltage control circuit is configured to control the gate-source voltage of the output transistor.

20. A display device, comprising the gate driving circuit of claim 19.

* * * * *